(12) United States Patent
Heath et al.

(10) Patent No.: US 7,587,650 B2
(45) Date of Patent: Sep. 8, 2009

(54) CLOCK JITTER DETECTOR

(75) Inventors: Matthew W. Heath, Hillsboro, OR (US); Mark Waggoner, Hillsboro, OR (US); Robert Greiner, Beaverton, OR (US); Brett W. Newkirk, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 451 days.

(21) Appl. No.: 11/636,101

(22) Filed: Dec. 8, 2006

(65) Prior Publication Data

US 2008/0141101 A1    Jun. 12, 2008

(51) Int. Cl.
*G06F 11/00* (2006.01)
*G06F 7/02* (2006.01)
*G06K 5/04* (2006.01)

(52) U.S. Cl. .................... 714/744; 714/700; 714/819
(58) Field of Classification Search ................ None
See application file for complete search history.

(56) References Cited

U.S. PATENT DOCUMENTS

| 7,002,334 B2 * | 2/2006 | Tanaka et al. ............ 324/76.11 |
| 7,340,655 B2 * | 3/2008 | Sugita ........................ 714/700 |
| 7,430,680 B2 * | 9/2008 | D'Luna et al. .............. 713/400 |

* cited by examiner

*Primary Examiner*—Christine T Tu
(74) *Attorney, Agent, or Firm*—Murthy S.K.

(57) ABSTRACT

A detector to detect the magnitude of the jitter that may occur in a first clock signal and a second clock signal and to generate an alarm signal if the magnitude of the jitter exceeds the threshold value. The detector comprises a one-hot register storing a one-hot value comprising a first logic bit (=1) centered around one or more second logic bits (=0). The detector comprises a threshold register storing a threshold value comprising one or more second logic bits centered around one or more first logic bits. An event of a first clock rotates the contents of the one-hot value and an event of a second clock rotates the contents of the threshold value. A match between the pre-specified bit of the one-hot value and the threshold value indicates the occurrence of the jitter having a magnitude greater than the threshold value.

19 Claims, 4 Drawing Sheets

| | | THRESHOLD VALUE | ERROR |
|---|---|---|---|
| EVENT | ONE-HOT VALUE (HV) | (TV) | STATUS |
| Initial | 0 0 0 1 0 0 0 0 | 1 0 0 0 0 0 0 1 | N |
| A | 0 0 0 0 1 0 0 0 | 1 0 0 0 0 0 0 1 | N |
| B | 0 0 0 0 1 0 0 0 | 1 1 0 0 0 0 0 0 | N |
| A | 0 0 0 0 0 1 0 0 | 1 1 0 0 0 0 0 0 | N |
| B | 0 0 0 0 0 1 0 0 | 0 1 1 0 0 0 0 0 | N |
| B | 0 0 0 0 0 1 0 0 | 0 0 1 1 0 0 0 0 | N |
| B | 0 0 0 0 0 1 0 0 | 0 0 0 1 1 0 0 0 | N |
| A | 0 0 0 0 0 0 1 0 | 0 0 0 1 1 0 0 0 | N |
| A | 1 0 0 0 0 0 0 0 | 0 0 0 0 1 1 0 0 | N |
| B | 1 0 0 0 0 0 0 0 | 0 0 0 0 1 1 1 0 | N |
| A | 0 1 0 0 0 0 0 0 | 0 0 0 0 1 1 1 0 | N |
| A | 0 0 1 0 0 0 0 0 | 0 0 0 0 1 1 1 0 | N |
| A | 0 0 0 1 0 0 0 0 | 0 0 0 0 0 1 1 1 | N |
| B | 0 0 0 1 0 0 0 0 | 0 0 0 0 0 1 1 1 | N |
| A | 0 0 0 0 1 0 0 0 | 0 0 0 0 0 1 1 1 | N |
| A | 0 0 0 0 0 1 0 0 | 0 0 0 0 0 0 1 1 | Y |
| A | 0 0 0 0 0 0 1 0 | 0 0 0 0 0 0 1 1 | Y |
| B | 0 0 0 0 0 0 1 0 | 1 0 0 0 0 0 0 1 | Y |
| B | 0 0 0 0 0 0 1 0 | 1 1 0 0 0 0 0 0 | Y |
| A | 0 0 0 0 0 0 0 1 | 1 1 0 0 0 0 0 0 | Y |

CLOCK JITTER DETECTOR

BACKGROUND

A system-on-chip (SoC) may comprise various sub-systems such as central processing unit (CPU) cores, I/O interfaces, and system logic interfaces. A system clock may be provided to each sub-system, each of which may generate derived clocks from the system clock. Characteristics of the derived clocks such as frequency, skew, and jitter may differ from the characteristics of the system clock. A data transfer device may be provisioned between a pair of sub-systems to transfer data units between the sub-systems.

The data transfer may require high performance and high reliability levels. However, unwanted deviations in the clocks such as jitter and skew may reduce the reliability level at which the data is transferred between the sub-systems. Detecting and responding to the occurrence of excessive jitter may increase the reliability of data transfer between the sub-systems. A jitter detector occupying minimal silicon area may decrease the cost of providing reliable data transfer.

BRIEF DESCRIPTION OF THE DRAWINGS

The invention described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements.

FIG. 4 illustrates a table 400 depicting the operation of the detector 150.

DETAILED DESCRIPTION

The following description describes a clock jitter detector. In the following description, numerous specific details such as logic implementations, resource partitioning, or sharing, or duplication implementations, types and interrelationships of system components, and logic partitioning, or integration choices are set forth in order to provide a more thorough understanding of the present invention. It will be appreciated, however, by one skilled in the art that the invention may be practiced without such specific details. In other instances, control structures, gate level circuits, and full software instruction sequences have not been shown in detail in order not to obscure the invention. Those of ordinary skill in the art, with the included descriptions, will be able to implement appropriate functionality without undue experimentation.

References in the specification to "one embodiment", "an embodiment", "an example embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, and digital signals). Further, firmware, software, routines, and instructions may be described herein as performing certain actions. However, it should be appreciated that such descriptions are merely for convenience and that such actions in fact result from computing devices, processors, controllers, and other such devices executing the firmware, software, routines, and instructions.

Figure 1:
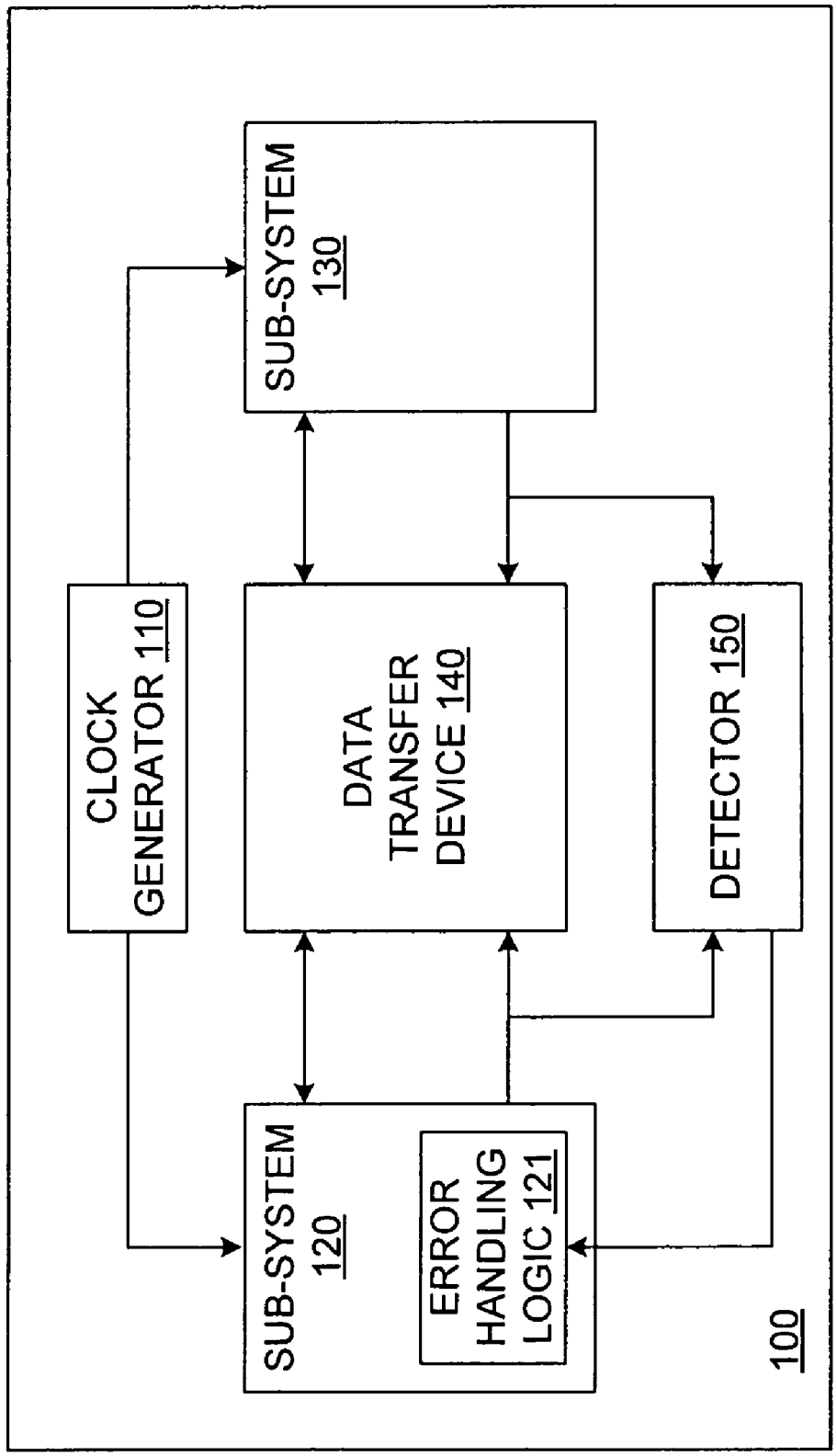
FIG. 1 illustrates an embodiment of a system 100.

An embodiment of a system 100 is illustrated in FIG. 1. The system 100 may comprise a clock generator 110, a sub-system 120, a sub-system 130, a data transfer device 140, and a detector 150.

In one embodiment, the system 100 may represent a processor such as Intel® Dual Core®, Pentium®, and such other family of Intel® processors. In one embodiment, the sub-system 120 may represent a central processing unit (CPU) core based, for example, on Intel® Architecture and the sub-system 130 may represent a system interface logic.

In one embodiment, the sub-system 120 may generate one or more data units that may be transferred to the sub-system 130 via the data transfer device 140. In one embodiment, the sub-system 120 may derive a first clock from the system clock received from the clock generator 110. In one embodiment, the components of the sub-system 120 may operate based on events A of the first clock. In one embodiment, the events A may refer to a rising edge or a trailing edge of each cycle of the first clock. In one embodiment, the sub-system 120 may comprise an error handling logic 121, which may generate error signals in response to receiving an alarm signal from the detector 150.

In one embodiment, the sub-system 130 may receive data units from the sub-system 120 via the data transfer device 140. However, the sub-system 130 may, also, send data units to the sub-system 120 via the data transfer device 140. The sub-system 130 may derive a second clock based on the system clock received from the clock generator 110. In one embodiment, the components of the sub-system 130 may operate based on the events B of the second clock.

The data transfer device 140 may transfer data units between the sub-system 120 and 130 based on the events of the first and the second clock. In one embodiment, the data transfer device 140 may comprise a storage element into which data units may be written based on the events A of the first clock provided by the sub-system 120. In one embodiment, the data units may be read from the storage element based on the events B of the second clock provided by the sub-system 130.

In one embodiment, the data transfer device 140 may be programmed with a parameter 'J' such that the data transfer device 140 malfunctions if the total jitter is greater than the parameter J. In one embodiment, the parameter J may be based on implementation specifics such as the type of the storage element, characteristics of the storage element, and such other similar factors. In one embodiment, Jitter may refer to an unwanted variation of one or more signal characteristics, such as the interval between successive pulses, the amplitude of successive cycles, the frequency, or the phase of successive cycles. Jitter may be caused by the electromagnetic interference (EMI) and cross talk with other signals.

In one embodiment, the data transfer device 140 may comprise, for example, a flip-flop, a synchronizer, a first-in-first-out (FIFO) type memory, or other similar type of memories. For example, the data transfer device 140 may comprise a FIFO memory. The write pointer to the FIFO may be controlled based on the events A of the first clock and the read pointer to the FIFO may be controlled based on the events B of the second clock. For example, the write pointer may point to a memory location X of the FIFO and the read pointer may point to a memory location (X+K) of the FIFO. The separation between the write and the read pointer may be determined by computing the distance between the write and the read pointer. For example, the distance of separation between the write and the read pointer may equal K (=X+K−X). In one embodiment, a smaller separation between the write and the read pointers may result in higher performance due to lower latency.

In one embodiment, jitter between the first clock and the second clock may cause the pointer separation K to become zero. In one embodiment, the pointer separation K becoming zero may cause a first unit of data stored in a storage element in the data transfer device 140 to be overwritten with a second unit of data by the sub-system 120 before the first unit of data is read by the sub-system 130. Such an error may be referred to as "overflow". In one embodiment, the pointer separation K becoming zero may cause a storage element in the data transfer device 140 to be read by the sub-system 130 before a unit of data has been written into the storage element by the sub-system 120. Such an error may be referred to as "underflow".

Both the overflow and underflow may be referred to as "pointer collision" and may lead to functional failure of the system 100. The probability of occurrence of a pointer collision is related to the probability that the magnitude of jitter between the first clock and the second clock exceeds the value of K. In one embodiment, the probability that the magnitude of jitter exceeds the value K may be smaller if the value of K is larger. Therefore, the reliability of the system 100 or the probability that functional failure of the system 100 does not occur may be higher if the pointer separation K is larger. However, a larger pointer separation K may result in lower performance of the system 100 due to higher latency through the data transfer device 140.

In one embodiment, the detector 150 may receive the first clock and the second clock, respectively, from the sub-system 120 and the second sub-system 130 and may detect the magnitude of the jitter between the first and the second clocks. In one embodiment, the detector 150 may generate a signal such as an alarm signal if the magnitude of the jitter is greater than the allowable value.

In one embodiment, the detector 150 may be configured to measure the clock jitter with sub-cycle precision. In one embodiment, a single detector such as the detector 150 may be used to detect the magnitude of the jitter between the first and the second clocks. Using a single detector 150 between the sub-systems 120 and 130 may be used as a low-cost alternative as compared, for example, to provisioning a collision detector with each FIFO provisioned in the data transfer device 140. Also, the size of the detector 150 may be based on the magnitude of the jitter to be detected. As the size of the detector 150 is independent of the size of the storage elements such as the FIFO, the detector 150 may consume less silicon area.

Figure 2:
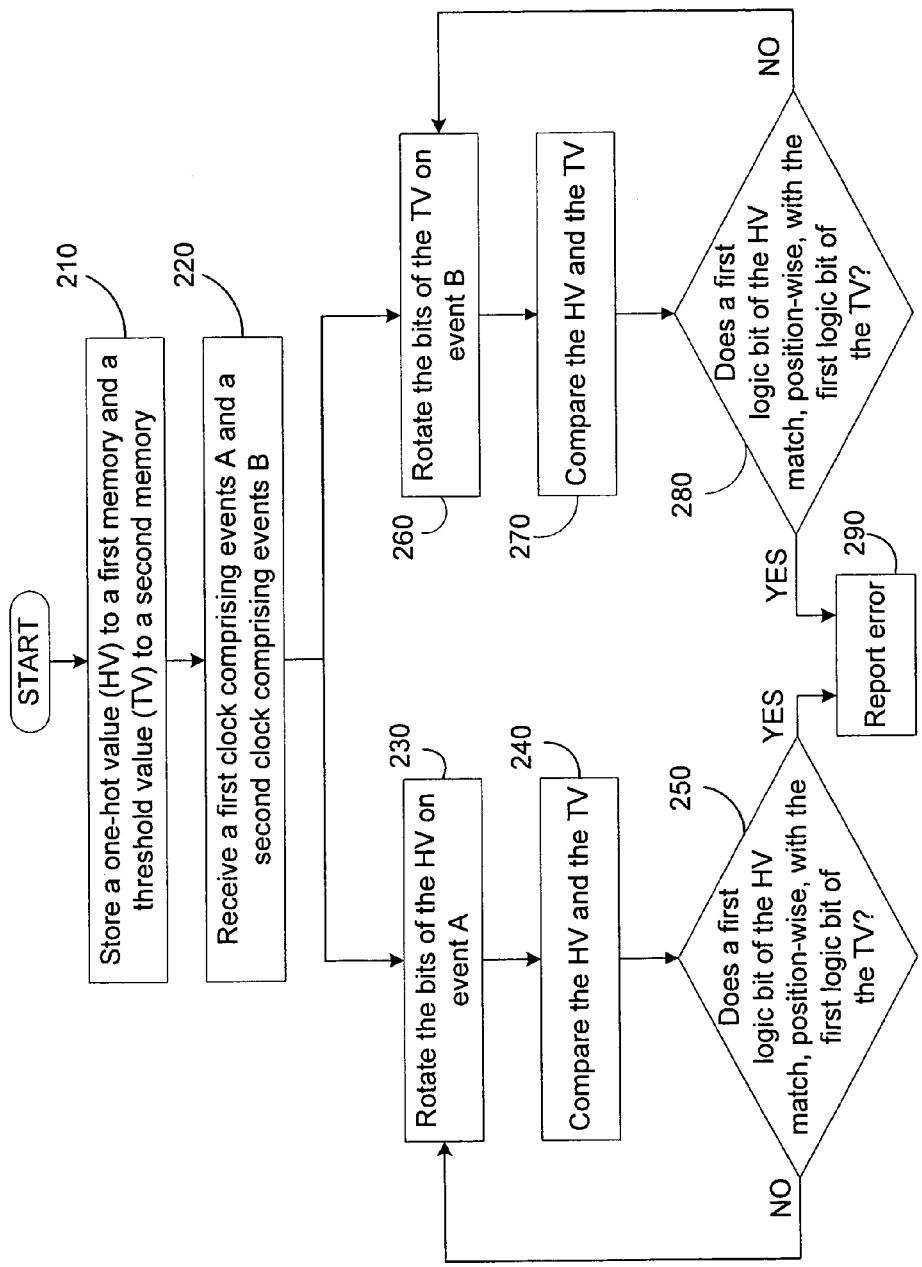
FIG. 2 illustrates an embodiment of a detector 150 detecting the magnitude of clock jitter.

An embodiment of the detector 150 detecting the magnitude of the clock jitter is illustrated in FIG. 2. In block 210, the detector 150 may store a one-hot value (HV) in a first memory and a threshold value (TV) in a second memory. In one embodiment, the one-hot value may comprise a first logic bit (e.g., 1) centered around one or more second logic bits (e.g., 0). For example, the one-hot value may equal 0001000.

In one embodiment, the threshold value (TV) may comprise one or more second logic bits (=0) centered around one or more first logic bits (=1). For example, the threshold value may equal 1100011. The number of second logic bits (0) that may be stored in the second memory may be based on the allowable level of the magnitude of the clock jitter. In one embodiment, the number of second logic bits (=0) in the threshold value may determine the magnitude of jitter that may be tolerable. In one embodiment, the maximum number of the second logic bits (0) that the threshold value may comprise may equal one less than the size of the second memory. If the size of the second memory equals Z, the maximum number of second logic bits (0) that may be stored in the second memory equals (Z−1).

In block 220, the detector 150 may receive the first clock comprising events A and the second clock comprising events B. In one embodiment, the events A may refer to the rising edges of the first clock and the events B may refer to the rising edges of the second clock.

In block 230, the detector 150 may rotate the bits of the one-hot value on occurrence of each event A. For example, the detector 150 may rotate the bits of the one-hot value towards the right on receiving each event A. For example, the one-hot value 0001000 may be rotated towards the right on occurrence of a first event A and as a result, the first memory may then comprise 0000100. In one embodiment, the first logic bit in the first memory such as the one-hot register 320 and the second memory such as the threshold register 330 may, position-wise, match if the magnitude of the clock jitter is greater than the allowable threshold value.

In block 240, the detector 150 may compare the one-hot value (HV) and the threshold value (TV) stored, respectively, in the first memory and the second memory.

In block 250, the detector 150 may check whether a first logic bit of the HV, position-wise, matches With a first logic bit of the TV and cause control to pass to block 290 if the first logic bit of the HV, position-wise, matches with a first logic bit of the TV and to block 230 otherwise.

In block 260, the detector 150 may rotate the bits of the threshold value on occurrence of each event B. For example, the detector 150 may rotate the bits of the threshold value towards the right on receiving each event B. For example, the threshold value 1100011 may be rotated towards the right on occurrence of a first event B and as a result, the second memory may comprise 1110001. In one embodiment, the first logic bit in the second memory and the first memory may, position-wise, match if the magnitude of the clock jitter is greater than the allowable threshold value.

In block 270, the detector 150 may compare the threshold value (TV) and the one-hot value (HV) stored, respectively, in the second memory and the first memory.

In block 280, the detector 150 may check whether a first logic bit of the HV, position-wise matches with a first logic bit of the TV and cause control to pass to block 290 if the first logic bit of the HV, position-wise, matches with a first logic bit of the TV and to block 260 otherwise.

In block 290, the detector 150 may report an error. In one embodiment, the detector 150 may generate an alarm signal to indicate the occurrence of an error and the alarm signal may be sent to error handling logic 121 of the sub-system 120.

Figure 3:
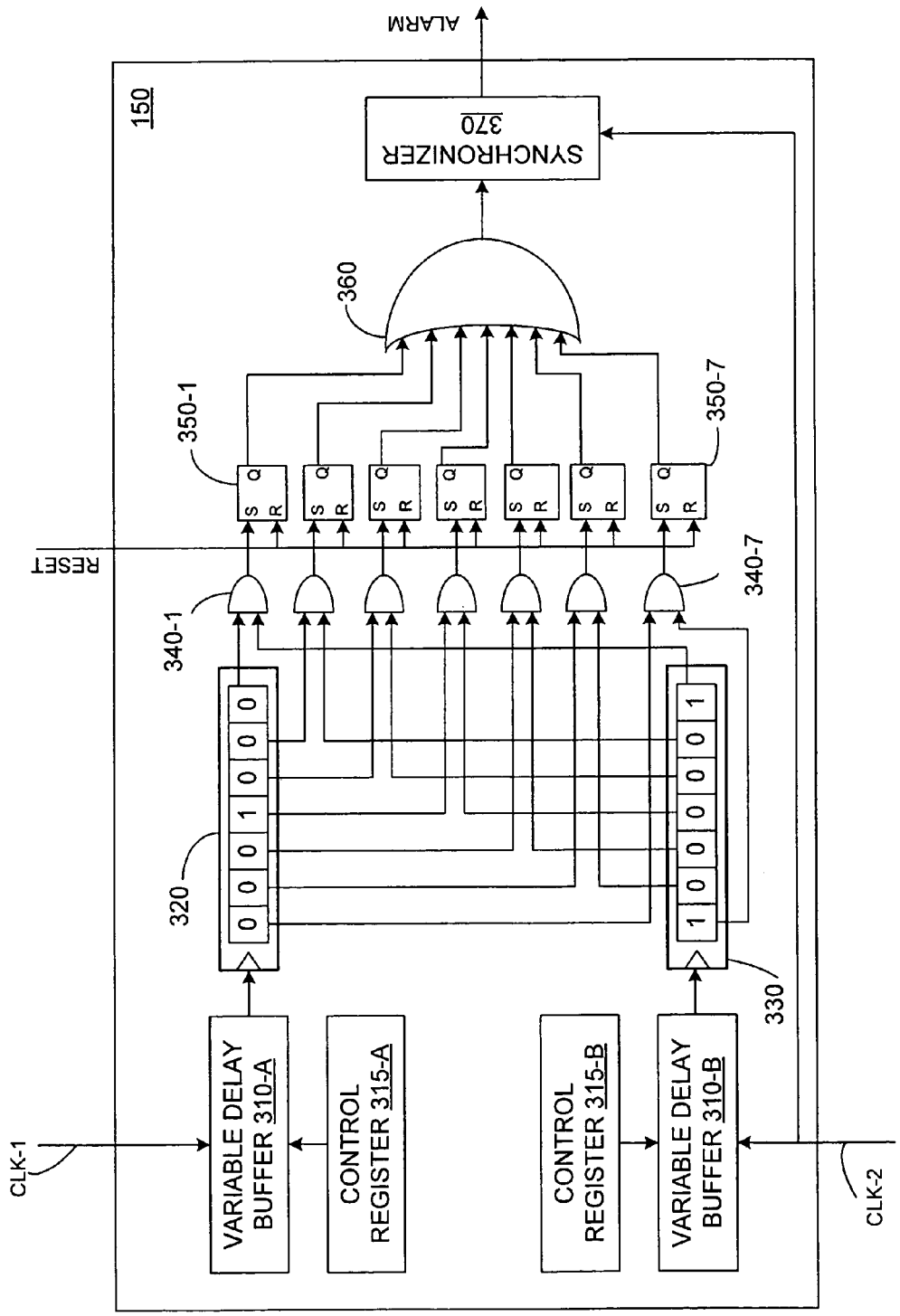
FIG. 3 illustrates an embodiment of the detector 150.

An embodiment of the detector 150 is illustrated in FIG. 3. In one embodiment, the detector 150 may comprise variable delay buffers 310-A and 310-B, control registers 315-A and 315-B, a one-hot register 320, a threshold register 330, AND gates 340-1 to 340-7, latches 350-1 to 350-7, an OR gate 360, and a synchronizer 370.

In one embodiment, the one-hot register 320 may be configured with a value comprising a first logic bit (e.g., 1), which is centered around one or more second logic bits (e.g., 0). For example, the one-hot register 320 may comprise a 7 bit value equaling '0001000'. In one embodiment, the one-hot register 320 may rotate towards the right the bits of the HV by one position on receiving an event A associated with a clock signal received from the variable buffer delay 310-A. In another embodiment, the one-hot register 320 may rotate towards the left the bits of the HV by one position on receiving an event A associated with a clock signal received from the variable delay buffer 310-A.

For example, the second bit (0) stored in the LSB position may be rotated towards the right and then stored in the MSB position and the second bit (0) stored in the MSB position may be shifted to (MSB-1) position on receiving a first event A. As a result, the one-hot register 320 may comprise '0000100' after receiving the first event A. In one embodiment, each bit of the one-hot register 320 may be coupled to a logic gate such as the AND gate. For example, the LSB bit may be coupled to the first input of the AND gate 340-1 and the MSB bit may be coupled to the first input of the AND gate 340-7.

In one embodiment, the size of the one-hot register 320 may, for example, equal 7 bits. In other embodiments, the maximum size of the one-hot register 320 may be chosen arbitrarily. For example, the maximum size of the one-hot register 320 may equal 2, 3, 6, 8, 11, or 15 bits and so on. However, the minimum size of the one-hot register 320 may equal 2 bits. In one embodiment, the size of the one-hot register 320 and the threshold register 330 may be equal.

In one embodiment, the threshold register 330 may be configured with a threshold value. In one embodiment, the threshold value may comprise the second logic bits (=0) centered around the first logic bits (=1). In one embodiment, the number of second logic bits (=0) in the threshold value may determine the magnitude of jitter that may be tolerable. In one embodiment, the length of the threshold register 330 may equal 'Z' and the threshold value may comprise a maximum of (Z−1) second logic bits (=0).

In one embodiment, the threshold register 330 may rotate to the right the bits of the threshold value by one position after receiving an event B associated with the clock signal provided by the variable delay buffer 310-B. In another embodiment, the threshold register 330 may rotate towards the left the bits of the TV if one-hot register 320 is programmed to rotate the bits towards the left. In one embodiment, both the one-hot register 320 and the threshold register 330 may rotate the bits either towards the right or towards the left. In one embodiment, each bit of the threshold register 330 may be coupled to a logic gate such as the AND gate. For example, the LSB bit of the threshold value may be coupled to the second input of the AND gate 340-1 and the MSB bit of the threshold value may be coupled to the second input of the AND gate 340-7.

In one embodiment, the AND gates 340-1 to 340-7 may each generate the first logic bit at the output if both of the inputs equal the first logic bit (=1) and may generate the second logic bit at the output if, at least, one input value equals the second logic bit (=0). In one embodiment, each AND gate 340-1 to 340-7 may receive, on the first input terminals, the least significant bit to the most significant bit of the one-hot value. Like-wise, the AND gates 340-1 to 340-7 may receive, on the second input terminals, the least significant to the most significant of the threshold value.

The output of the AND gates 340-1 to 340-7 may be provided as set (S) inputs to the latches 350-1 to 350-7, respectively. In one embodiment, the set input S and the reset input R of the latches 350-1 to 350-7 may be initialized, respectively, with logic 0 and 1 and the output Q, as a result of initialization, may equal 0. During subsequent periods of operation, the reset input R of the latches 350 may be maintained at logic 0 and each latch 350-1 to 350-7 may transfer a logic 1 received on set input S to the output Q. For example, the latch 350-1 may transfer logic 1 to the output Q if the latch 350-1 receives logic 1 on the S input. In one embodiment, logic 0 on both the S and the R inputs may cause the latches 350-1 to 350-7 to retain the previous value on the outputs Q. The output of the latches 350-1 to 350-7 may be provided as inputs to the OR gate 360. The OR gate 360 may generate the first logic bit as the output if, at least, one of the input values equals the first logic bit and may generate the second logic bit otherwise.

The output of the OR gate 360 may be provided to the synchronizer 370, which may transfer the output of the OR gate 360 to the alarm output on receiving a clock signal. In one embodiment, the clock signal may be provided from a first clock, a second clock, or some other such clock. In one embodiment, if the output of the OR gate 360 equals the first logic bit, the synchronizer 370 may transfer the first logic bit to the output, which may be provided as the alarm signal to the error handling logic 121.

In one embodiment, the variable delay buffer 310-A may receive the first clock and generate a delayed first clock, which may be provided as clock input to the one-hot register 320. In one embodiment, the variable delay buffer 310-A may generate the delayed first clock by delaying the first clock by an amount 'N', which may be based on a first delay value stored in the control register 315-A. In one embodiment, the value of N may equal 0/8, 1/8, 2/8, 3/8, 4/8, 5/8, 6/8, or 7/8 of the period of the first clock based on an integer value 0 to 7 stored the control register 315-A. Similarly, the variable delay buffer 310-B may generate a delayed second clock based on the value stored in the control register 315-B.

In one embodiment, the first delay value may tune the variable delay buffer 310-A to modulate, with sub-cycle precision, the skew between the delayed first clock and the delayed second clock. In the process of modulating the skew between the delayed first and the second clock, the variable delay buffer 310-A may modulate, with sub-cycle precision, the point at which the jitter magnitude exceeds the threshold value (TV). The modulation technique of the variable delay buffers 310-A and 310-B is described below.

In one embodiment, the total jitter accumulated between the first clock and the second clock after the detector 150 is reset may equal T. For example, let the one-hot value stored in the one-hot register 320 equal 0100000 and the threshold value stored in the threshold register 330 equal 1000001. At time point D0, the threshold register 330 may receive an event B and rotate towards the right the bits of the threshold value 1000001. As a result of the rotation, the threshold register 330 may hold a value equaling 1100000. The first logic bit (=1) at (MSB-1) position of both the one-hot value (0100000) and the threshold value (1100000) may match. The logic 1 in (MSB-1) position of both the threshold and the one-hot value may cause the AND gate 340-6 to transition from 0 to 1.

At a later time point D1, the one-hot register 320 may receive an event A and may rotate towards the right the bits of the one-hot value 0100000. As a result of rotation, the contents of the one-hot register 320 may equal 0010000. The AND gate 340-6 may transition from 1 to 0 as the first input equals 0. The width of the pulse at the output of the AND gate 340-6 due to the transition from 0 to 1 at D0 and 1 to 0 at D1 may substantially equal (D1−D0). Also, the latches 350 may comprise an implementation-specific parameter 'M', which may, for example, represent the response time of the latches. In one embodiment, the latches 350 may respond to the pulse provided at the S input if the width of the pulse (D1−D0) is greater than M by transitioning the Q output from 0 to 1. The synchronizer 370 may generate an alarm signal only if (D1−D0)>M. The data transfer device 140 may malfunction if {T+(D1−D0)}>J.

If (J−T)<(D1−D0)<M, the detector 150 may not detect the jitter that may exceed the threshold value. To avoid such a situation, the variable delay buffer 310-A may vary the delay of the first clock before the delayed first clock is provided to the one-hot register 320. In one embodiment, a first delay value stored in the control register 315-A may be chosen to add an extra delay of N time units to the first clock before the delayed first clock is provided to the one-hot register 320. As a result, the one-hot register 320 may rotate the one-hot value (0100000) at a time-point (D1+N), wherein the threshold value is rotated by the threshold register 330 at a time point D0. Such an approach may cause the width of the pulse at the output of the AND gate 340-6 to last for {(D1−D0)+N} time units. If the value of N is chosen such that {(D1−D0)+N}>M, the detector 150 may detect the jitter that exceeds the threshold value and generate an alarm signal. In one embodiment, the variable delay buffer 310-B may use similar modulation techniques to generate a delayed clock from the second clock.

In one embodiment, the variable delay buffer 310-A may comprise one or more variable delay elements. In one embodiment, each variable delay element may comprise a logic, which may select one of a delayed clock input or an un-delayed clock input based on the bit of the first delay value provided to the variable delay element. In one embodiment, the variable delay element may receive a clock input and generate the delayed clock input by passing the clock input through a series of inverters. In one embodiment, the logic may comprise a 2-input multiplexer, which may be provided with the delayed clock input and the un-delayed clock input, respectively, on the first and the second input terminal. In one embodiment, the 2-input multiplexer may pass the delayed clock input if the bit value provided to the select input of the 2-input multiplexer equals logic 1 and may pass the un-delayed clock otherwise.

In one embodiment, the variable delay buffer 310-B may provide a delayed second clock to the threshold register 330. In one embodiment, the variable delay buffer 310-B may operate in a manner similar to that of the variable delay buffer 310-A, except that the variable delay buffer 310-B may provide a delayed second clock to the threshold register 330. In one embodiment, the amount by which the second clock is delayed may be based on a second delay value stored in the control register 315-B.

An embodiment of the detector 150 detecting the jitter if the magnitude is greater than the threshold value is illustrated in FIG. 4. Row 405 comprises event=initial, one-hot value=0001000, threshold value=1000001, and error status=N. Initial indicates that the one-hot value and the threshold value stored, respectively, into the one-hot register 320 and the threshold register 330 are the initial values. Also, an N in the error status may indicate that no error has occurred as the magnitude of the jitter may be within the allowable values. If the first logic bit of the HV does not, position-wise, match with a first logic bit of the TV, it may be concluded that the magnitude of the jitter is within the allowable value and the synchronizer 370 may not generate an alarm signal.

Row 410 depicts event=A, one-hot value=0000100, threshold value=1000001, and error status=N. Event=A may indicate that the one-hot register has received a un-delayed or delayed first clock from the variable delay buffer 310-A and the one-hot register 320 contents may be rotated rightwards. The one-hot value (0001000 of row 405) has moved rightwards by one bit position and the resulting one-hot value is shown, in row 410, as 0000100. However, the threshold value may remain un-changed as the threshold register 330 may rotate the threshold value only on occurrence of event B. Like-wise, rows 415 to 475 depict one-hot value and threshold value rotated rightwards, respectively, on occurrence of events A and B. The error status remains N as there exists no, position-wise, match for the first logic bit (1) of the one-hot value and the threshold value.

Row 480 depicts event=A, one-hot value=0000010, and threshold value=0000011, and error status=Y. The first bit value (=1) of one-hot value that is at (MSB-5) position matches with a '1' at the (MSB-5) position bit value of the threshold value. As a result, the error status may be set to Y and the synchronizer 370 may generate an alarm signal. Rows 485-495 depict the one-hot value and the threshold rotated rightwards, respectively, on occurrence of events A and B. However, the error status may continue to equal Y, in rows 485-495, to indicate the occurrence of error in row 480.

Certain features of the invention have been described with reference to example embodiments. However, the description is not intended to be construed in a limiting sense. Various modifications of the example embodiments, as well as other embodiments of the invention, which are apparent to persons skilled in the art to which the invention pertains are deemed to lie within the spirit and scope of the invention.

What is claimed is:

1. A method comprising:
    receiving a first plurality of events timed by a first clock and a second plurality of events timed by a second clock;
    rotating the bits of the one-hot value stored in a first memory in response to receiving an event of the first plurality of events and the bits of the threshold value stored in a second memory in response to receiving an event of the second plurality of events;
    determining whether a first logic bit of the one-hot value matches position-wise with a first logic bit of the threshold value; and
    generating an alarm signal if the first logic bit of the one-hot value matches position-wise with the threshold value.

2. The method of claim 1, wherein the threshold value represents a maximum allowable magnitude of the jitter.

3. The method of claim 2, wherein the threshold value comprises a set of second logic bits that is centered around one of a plurality of first logic bits.

4. The method of claim 3, wherein the maximum value of the second logic bits in the threshold value is based on the size of the second memory.

5. The method of claim 1, wherein the one-hot value comprises one of a plurality of first logic bits that is centered around a second logic bit.

6. The method of claim 1 further comprising generating an error signal in response to generating the alarm signal.

7. The method of claim 1 further comprising modulating a point at which the jitter magnitude exceeds the threshold value.

8. An apparatus comprising
a one-hot register to store a one-hot value,
a threshold register to store a threshold value,
a set of logic devices coupled to the one-hot register and the threshold register to determine whether a first logic bit of the one-hot value matches position-wise with the threshold value after rotating the bits of the one-hot value upon receiving an event generated based on a first clock and after rotating the bits of the threshold value upon receiving an event generated based on a second clock, and
wherein the set of logic devices is to generate an alarm signal if the first logic bit of the one-hot value matches position-wise with the threshold value.

9. The apparatus of claim 8, wherein the threshold value represents a maximum allowable magnitude of the jitter.

10. The apparatus of claim 9, wherein the threshold register to store a set of second logic bits that is centered around one of a plurality of first logic bits.

11. The apparatus of claim 10, wherein the maximum value of the second logic bits in the threshold value is based on the size of the second memory.

12. The apparatus of claim 8, wherein the one-hot register to store the one-hot value comprises one of a plurality of first logic bits that is centered around a second logic bit.

13. The apparatus of claim 8 further comprises a first variable delay buffer coupled to the one-hot register to modulate a point at which the jitter magnitude exceeds the threshold value.

14. The apparatus of claim 8 further comprises a second variable delay buffer coupled to the threshold register to modulate a point at which the jitter magnitude exceeds the threshold value.

15. A system comprising:
a first sub-system to generate data units based on events timed on a first clock;
a data transfer device coupled to the first sub-system to transfer data units from the first sub-system to a second sub-system;
the second sub-system coupled to the data transfer device to receive the data units based on events timed on a second clock; and
a detector-coupled to the first sub-system and the second sub-system
to detect the magnitude of the jitter by comparing a one-hot value and a threshold value, wherein a plurality of bits of the one-hot value is rotated based on the events of the first clock and a plurality of bits of the threshold value is rotated based on the events of the second clock; and
to generate an alarm signal if a first logic bit of the one-hot value, position-wise, matches with the first logic bit of the threshold value.

16. The system of claim 15 the detector comprises
a one-hot register to store the one-hot value,
a threshold register to store the threshold value, and
a set of logic devices coupled to the one-hot register and the threshold register to determine whether the first logic bit of the one-hot value, position-wise, matches with the first logic bit of the threshold value after rotating the bits of the one-hot value on receiving an event of the first clock and after rotating the bits of the threshold value on receiving an event of the second clock.

17. The system of claim 16, wherein the detector further comprises
a first variable delay buffer coupled to the one-hot register to modulate a point at which the jitter magnitude exceeds the threshold value, and
a second variable delay buffer coupled to the threshold register to modulate a point at which the jitter magnitude exceeds the threshold value.

18. The system of claim 15, wherein the first sub-system further comprises a error handling logic, which generates an error signal in response to receiving the alarm signal from the detector.

19. The system of claim 18, wherein the error handling logic avoids collision of a write pointer pointed to a first memory location of a first-in-first-out memory and a read pointer pointed to a second memory location of the first-in-first-out memory of the data transfer device in response to receiving the alarm signal.

* * * * *